United States Patent
Aue

(10) Patent No.: US 8,453,020 B2
(45) Date of Patent: May 28, 2013

(54) METHOD FOR DETECTING THE VALIDITY OF DOWNLINK CONTROL INFORMATION IN TELECOMMUNICATION USER EQUIPMENT, DECODER AND BASEBAND RECEIVER FOR PERFORMING SAME

(75) Inventor: Volker Aue, Dresden (DE)

(73) Assignee: Intel Mobile Communications Technology Dresden GmbH, Dresden (DE)

( * ) Notice: Subject to any disclaimer, the term of this patent is extended or adjusted under 35 U.S.C. 154(b) by 155 days.

(21) Appl. No.: 13/159,144

(22) Filed: Jun. 13, 2011

(65) Prior Publication Data

US 2012/0151285 A1 Jun. 14, 2012

(30) Foreign Application Priority Data

Jun. 11, 2010 (EP) ..................................... 10165694

(51) Int. Cl.
G06F 11/00 (2006.01)
H03M 13/03 (2006.01)
H04L 5/12 (2006.01)
H04L 1/00 (2006.01)

(52) U.S. Cl.
CPC .................................. *H04L 1/0054* (2013.01)
USPC ............ 714/704; 714/786; 714/795; 375/262

(58) Field of Classification Search
USPC .......... 714/704, 746, 786, 794–796; 375/224, 375/225, 228, 259, 262
See application file for complete search history.

(56) References Cited

U.S. PATENT DOCUMENTS

| 5,446,763 A * | 8/1995 | Baum et al. .................... 375/340 |
| 5,949,796 A * | 9/1999 | Kumar ........................... 370/529 |
| 7,027,532 B2 * | 4/2006 | Lauer ............................. 375/341 |
| 2009/0257385 A1 | 10/2009 | Meylan et al. |

\* cited by examiner

*Primary Examiner* — Christine Tu
(74) *Attorney, Agent, or Firm* — SpryIP, LLC

(57) ABSTRACT

A method for detecting validity of downlink control information in telecommunication user equipment and a decoder and baseband receiver to perform the method are provided. The object of avoiding falsely detecting payload data and misinterpreting them is achieved by reverse encoding a bit output sequence of a Viterbi decoder; determining hard bits from a soft-bit input sequence of the decoder; determining a bit count of real received bits; comparing the reverse encoded bit stream to the determined hard bit stream and counting the number of mismatches to obtain an error count; comparing a bit error rate which is defined as a quotient of the error count and the bit count against a predefined threshold value; and rejecting the payload as invalid if said bit error rate is above said threshold value, even if a cyclic redundancy check of the payload gives a correct result.

9 Claims, 9 Drawing Sheets

METHOD FOR DETECTING THE VALIDITY OF DOWNLINK CONTROL INFORMATION IN TELECOMMUNICATION USER EQUIPMENT, DECODER AND BASEBAND RECEIVER FOR PERFORMING SAME

CROSS REFERENCE TO RELATED APPLICATIONS

This application claims priority of European application No. 10165694.0 filed on Jun. 11, 2010, the entire contents of which is hereby incorporated by reference herein.

FIELD OF THE INVENTION

The invention relates to a method for detecting the validity of downlink control information in telecommunication user equipment. The invention also relates to a decoder and a baseband receiver including the decoder designed to perform that method.

BACKGROUND OF THE INVENTION

The LTE (Long Term Evolution) standard uses a rate one third constraint length seven tail biting convolutional code for encoding control information sent out in the Physical Downlink Control Channel (PDCCH). The message is protected by a 16 bit Cyclic Redundancy Checksum (CRC) which is XORed with the Medium Access Control (MAC) Identifier (ID) of the User Equipment (UE). As the control information is very short, tail biting has been selected by the standardization body in order to save the six tail bits that otherwise would have been needed to be added to the message for reliable decoding.

At the transmitter, the convolutional encoded data is rate matched. Rate matching describes a technique of interleaving and puncturing, i.e., omitting encoded bits, or repetition, i.e., inserting encoded bits by duplicating existing bits to achieve a data rate that suits the frame format best.

Viterbi decoding is a means for maximum likelihood (ML) sequence estimation. The Viterbi decoder is known to provide an ML estimate for received data that has been convolutional encoded. By prepending a cyclic extension of the received code word and appending a cyclic extension to the code word, a tail biting convolutional code can be decoded. A 3GPP receiver XORs the calculated CRC to the received CRC and compares the result with its own MAC-ID. Only if the MAC-ID matches, the receiver assesses the payload. The modem has to make 44 blind decoding attempts per LTE subframe, i.e., 44 blind decoding attempts every 1 ms.

Since the short length of the CRC provides only a very weak protection, a relatively high likelihood exists that a PDCCH is detected even though the UE is not addressed. US 2009/0257385 A1 ("Filtering semi-persistent scheduling false alarms" by Arnaud Meylan et al.) suggests a plausibility check to filter out erroneously detected valid PDCCH information.

As mentioned above, the 16 bit CRC provides a weak protection against falsely detecting payload data and misinterpreting those. A falsely detected PDCCH can cause the UE to transmit unsolicited information.

Assuming that the output sequence of the Viterbi decoder is purely random, the likelihood of detecting a false PDCCH is $44/(2^{16}-1)$. This translates into one false positive roughly every 1.5 secs.

In case the information contained in the payload is plausible to the UE, i.e., other parameters are within their valid range, the UE may unsolicited send a frame.

Unsolicited transmission of frames reduces the network performance as this interference is likely to collide with other user's frames that are correctly sent in the scheduled allocations.

An object of the invention is to find a way to distinguish between a correctly detected PDCCH and a presumably correct but falsely detected PDCCH to avoid falsely detecting payload data and misinterpreting them. A more particular object of the invention is false positive avoidance for PDCCH blind decoding in LTE.

SUMMARY OF THE INVENTION

The invention provides a method for detecting the validity of downlink control information in a telecommunications terminal, the method comprising the steps of: reverse encoding a bit output sequence of a Viterbi decoder of a baseband receiver of the terminal using a similar convolutional encoder as the one used at a transmitting side; determining hard bits from a soft-bit output sequence of a demapping operation of the baseband receiver; determining, for each of the hard bits, whether the soft-bit from which it was derived was a real received bit or was inserted at the receiver in a rate de-matching operation, to obtain a bit count of real received bits; comparing the re-encoded bit stream to the determined hard bit stream and counting the number of mismatches to obtain an error count; determining a bit error rate as a quotient of the error count and the bit count; comparing the bit error rate against a predefined threshold value; and assuming the payload to be invalid if the bit error rate is above the threshold value, even if a cyclic redundancy check of the payload gives a correct result.

By selecting the threshold low enough, the false positive probability can be virtually reduced to zero. This is in contrast to other techniques that rely on a plausibility check of the payload information. Nevertheless, the invention allows making use of other techniques on top.

For convolutional reverse encoding, the six last bits of the cyclic extension to the right of the received code block may be used to initialize the reverse encoding operation.

A preferred embodiment of the method additionally comprises counting the number of bits that have been omitted in a rate matching operation at the transmitter. The method may further comprise adapting the bit error rate threshold value in function of the rate of omitted bits.

According to another aspect of the invention, there is provided a Viterbi convolutional decoder which comprises a branch metric processor, a path metric processor, a trace back memory, a trace back logic unit, and a finite state machine. The decoder according to the invention is characterized in that it further comprises hard decision means that are operative to determine hard bits from a soft-bit input sequence to the Viterbi decoder; and reverse encoder and hard bit error estimation means, comprising:
a reverse encoder similar to the convolutional decoder used at a transmitting side and operative to reverse encode a bit output sequence of the trace back logic unit; means for counting a number of non-punctured bits to obtain a bit count; means for counting the number of mismatches between the re-encoded bit stream from the reverse encoder and the hard bit stream from the hard decision means to obtain an error count; wherein the Viterbi convolutional decoder is operative to provide the bit count and the error count for an additional validity check on the payload bits output by the decoder. In one embodiment, the reverse encoder uses reversed polynomials for encoding.

According to yet another aspect of the invention, there is provided an LTE baseband receiver which at least comprises an equalizer, a demapper, a rate de-matcher, a Viterbi convolutional decoder as set forth above, a cyclic redundancy check (CRC) block operative to calculate a CRC checksum over the payload output from the decoder, an XOR gate for XOR combining the calculated CRC checksum and the received checksum, and a match detector operative to compare the output of the XOR gate to a Medium Access Control (MAC) identifier of the receiver to check for validity of the payload decoded by the Viterbi convolutional decoder. The decoder is operative to forward the bit count and identifier error count to the match detector, and the match detector is operative to: determine a bit error rate as a quotient of the error count and the bit count; to compare the bit error rate against a predefined threshold value; and to reject the payload as invalid in case the bit error rate is above the threshold value, irrespective of the result of the MAC identifier match.

In a specific embodiment, the rate de-matcher is operative to produce a code block of bits in reverse order. In that case, the reverse encoder of the Viterbi convolutional decoder uses non-reversed polynomials for encoding.

The described solution relies on the structure of the convolutional code and makes use of the error correcting capabilities of the Viterbi decoder. No other information of the payload is assessed than the evaluation of the CRC to reveal the MAC-ID. As mentioned above, by selecting the thresholds low enough, the false positive probability can be virtually reduced to zero. The technique only requires a few extra counters and comparators and a small buffer for buffering hard decided bits and puncturing information.

BRIEF DESCRIPTION OF THE DRAWINGS

Additional features and advantages of the present invention will be apparent from the following detailed description of preferred embodiments which is given by way of example only and in which reference will be made to the accompanying drawings, wherein.

DETAILED DESCRIPTION

In order to illustrate the Viterbi decoding process for tail biting convolutional codes, the following model and conventions are used.

At the transmitter side, a sequence of bits $c_k$ to be encoded is passed through a convolutional encoder.

Figure 1:
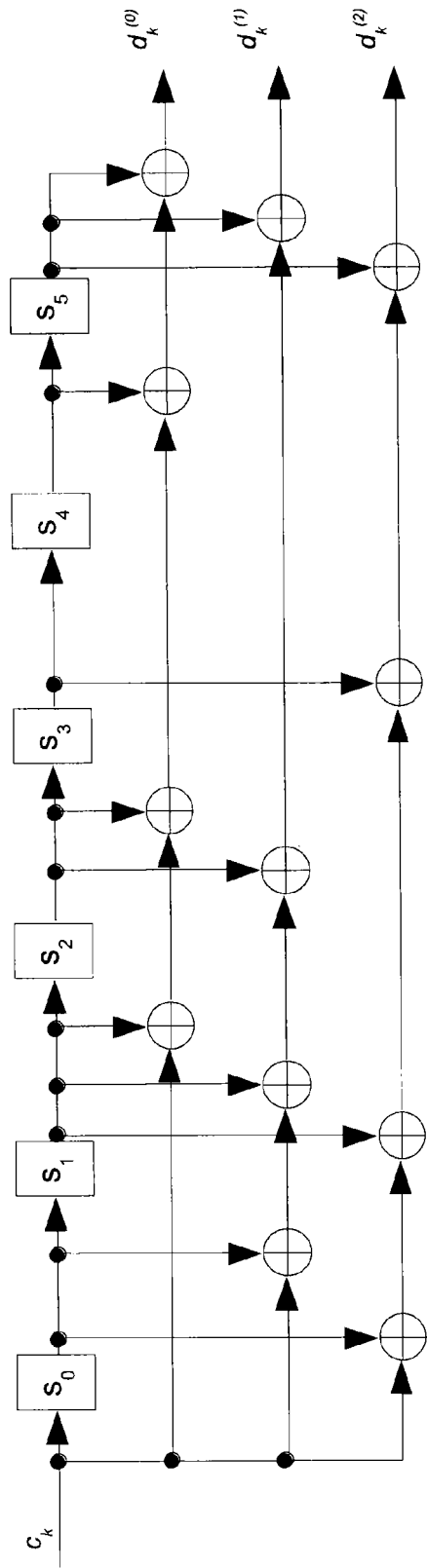
FIG. 1 illustrates an LTE rate ⅓ convolutional encoder.

FIG. 1 shows the convolutional encoder as defined by 3GPP that uses the polynomials $G_0$=133 (octal), $G_1$=171 (octal), $G_2$=165 (octal). The adders shown in FIG. 1 denote an XOR operation. The six delay elements s0 to s5 hold one bit each. For tail biting, the delay elements are initialized with the last six bits of the payload. For each bit $c_k$, the convolutional encoder produces three output bits $d_k(0)$ to $d_k(2)$, respectively. Those output bits are further subject to rate matching and modulation.

At the receiver, the received symbols are first equalized and demapped, the demapping producing so called soft bits that include the likelihood with which a received bit is valid. The format assumed in the present description uses a positive soft bit value representing a received logical one, a negative soft bit value representing a logical zero, and a zero value indicating equal likelihood for a logical one or zero. Other soft bit representations are of course possible for different Viterbi decoder implementations. The novelty of the present invention is independent of the Viterbi decoder implementation.

Figure 2:
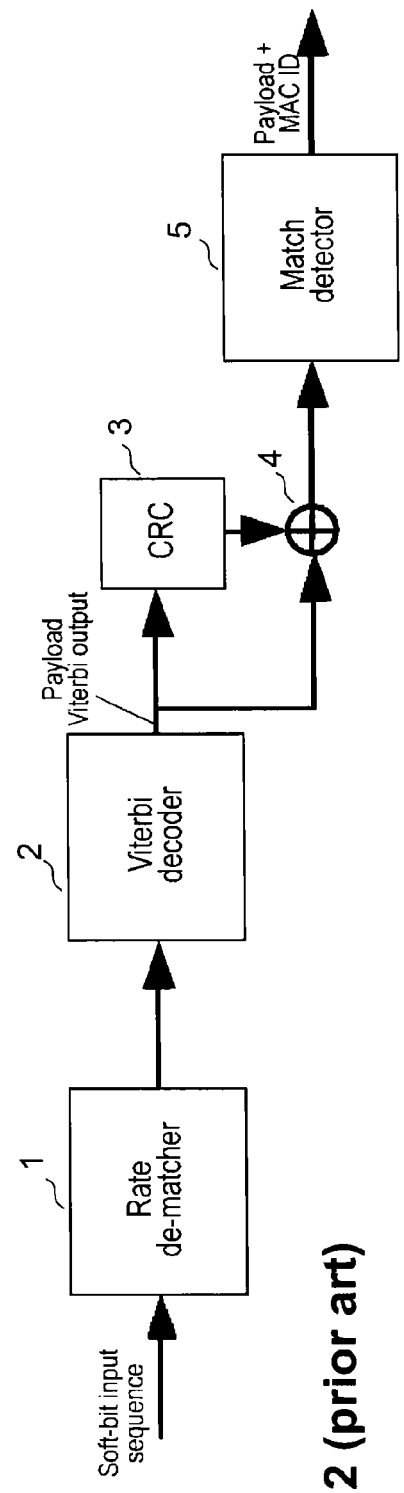
FIG. 2 shows a part of a known baseband receiver chain.

FIG. 2 shows a portion of a conventional baseband receiver chain following demapping. The soft-bits resulting from demapping are subjected to rate de-matching, at 1, before they are presented to the convolutional decoder 2. For convolutional decoding, a Viterbi decoder is most commonly used. The Viterbi decoder is the optimum decoder for decoding convolutional encoded data.

Figure 3:
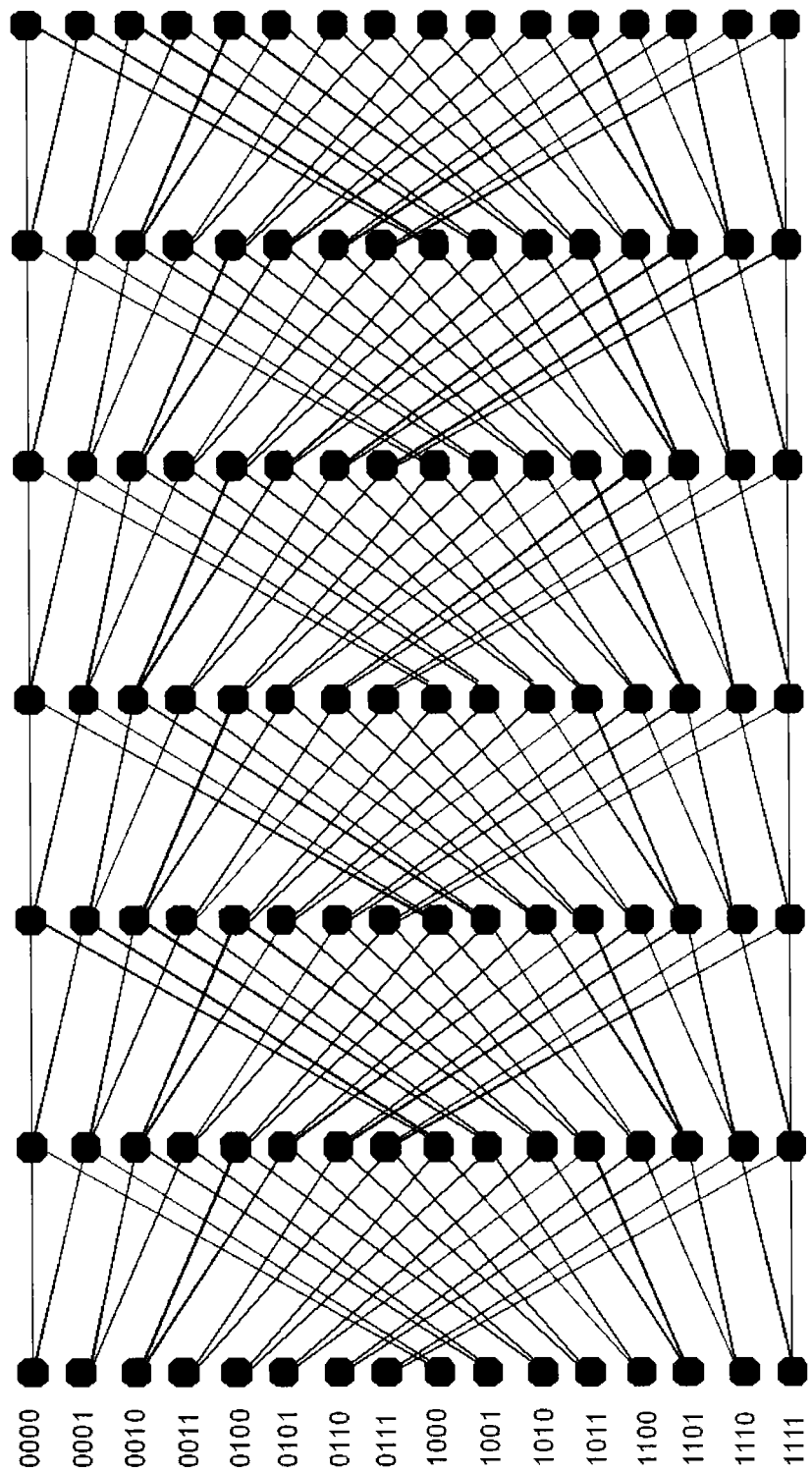
FIG. 3 shows a Trellis diagram for a constraint length 5 convolutional code.

The Viterbi decoder makes use of the finite impact a newly inserted bit in the convolutional encoder can have on the output bit. The number of output vectors that are affected by the state of one bit at the input of the convolutional encoder is referred to as the constraint length. The Viterbi decoder for decoding an LTE code uses 64 internal states that correspond to the possible states ($s_0$ to $s_5$) in the convolutional encoder. The specific structure of the convolutional encoder that only allows for shifting in new bits yield a so called trellis diagram that shows the possible transitions from one state of a specific iteration to the possible states of the next iteration. The iterations of the Viterbi algorithms are called trellis steps. An example of a trellis diagram for a convolutional code with constraint length 5 is shown in FIG. 3. The states of the convolutional encoder are given on the left hand side of FIG. 3 in binary representation with the least significant bit to the right.

Figure 4:
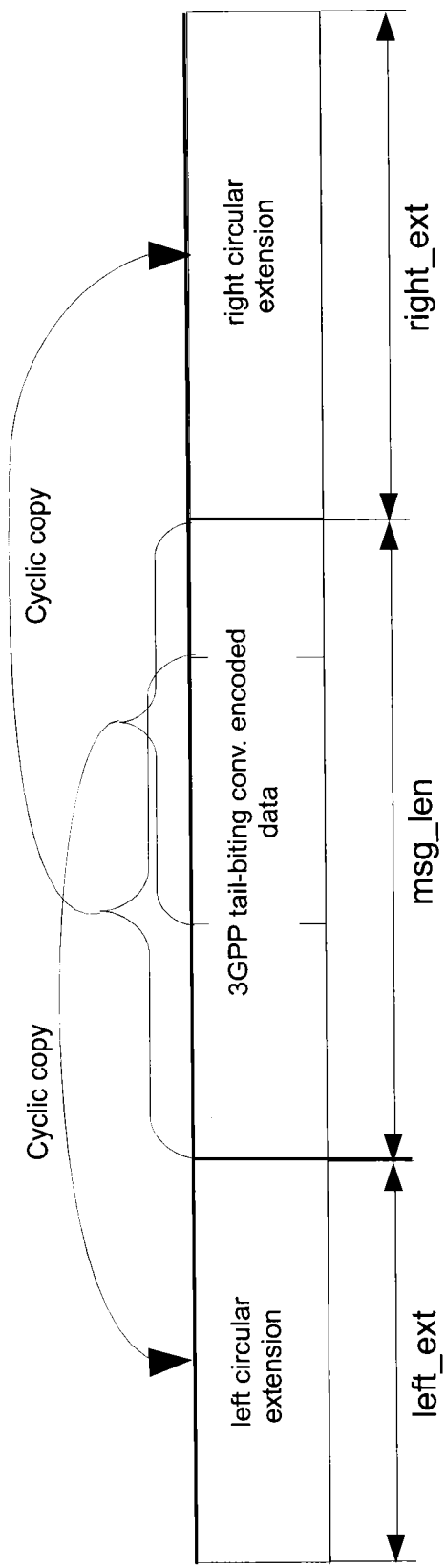
FIG. 4 shows extension of a tail biting convolutional code for Viterbi decoding.

For decoding a tail biting convolutional code, the received code block is first cyclically extended to the left and to the right by prepending the last soft-bits of that block to the front, and appending the first soft-bits of that block to the end, as shown in FIG. 4.

Figure 5:
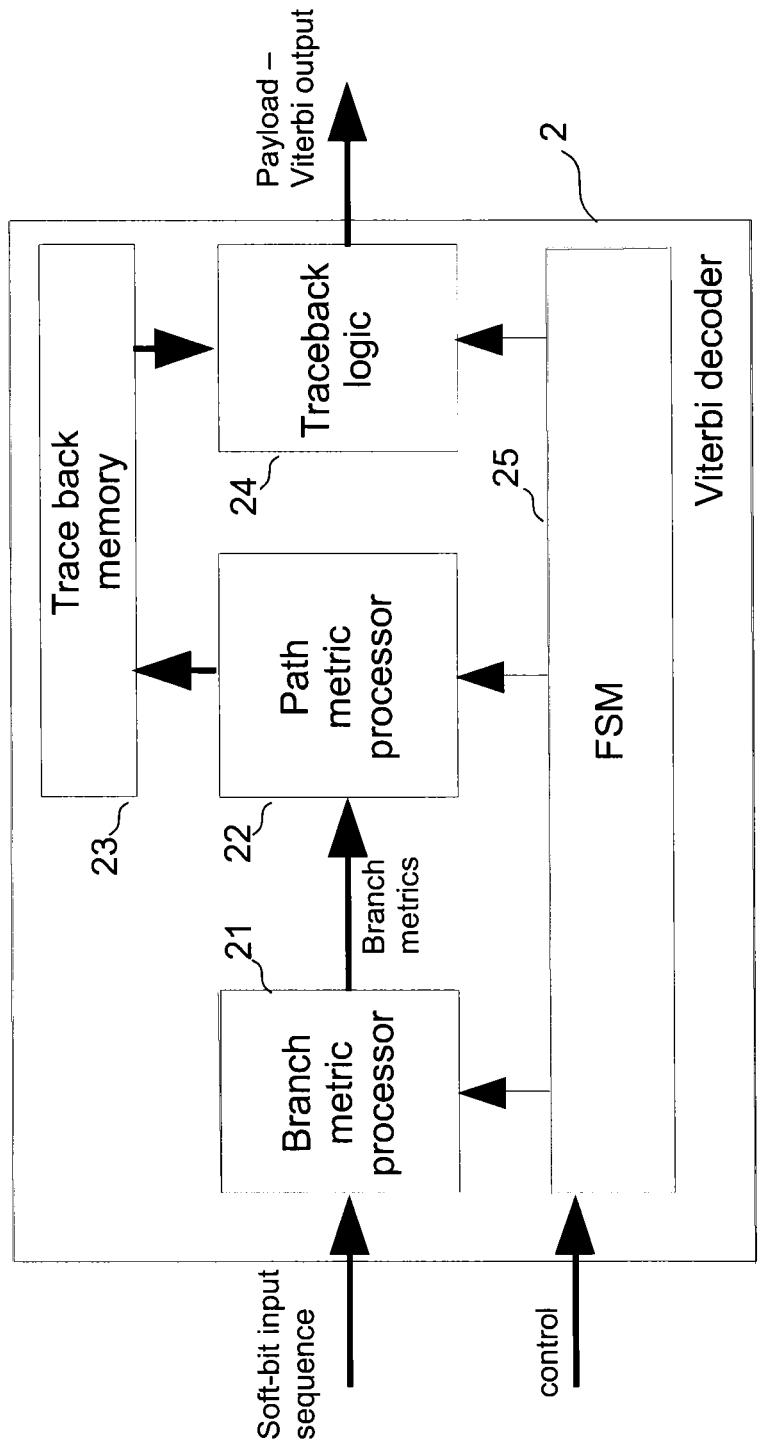
FIG. 5 shows a block diagram of a conventional Viterbi decoder.

FIG. 5 shows a block diagram of the conventional Viterbi decoder 2 of FIG. 2. Decoder 2 comprises of a branch metric processor 21 that takes the input sequence, typically soft-bits, and calculates the so called branch metrics. The soft-bit input sequence includes a plurality of bits, each soft-bit representing a received bit along with the likelihood with which it is received. Typically, a two's complement representation of a soft bit is chosen, wherein the sign thereof represents the received bit and its absolute value represents the likelihood for the bit being received correctly. For a rate ⅓ convolutional code, as used in LTE, the Viterbi decoder consumes three soft bits for each trellis step. From each triplet of soft bits, branch metric processor 21 calculates all eight possible branch metrics for the required trellis step.

The branch metrics are then presented to a path metric processor 22 which calculates all path metrics of the trellis from one trellis step to the next.

Figure 6:
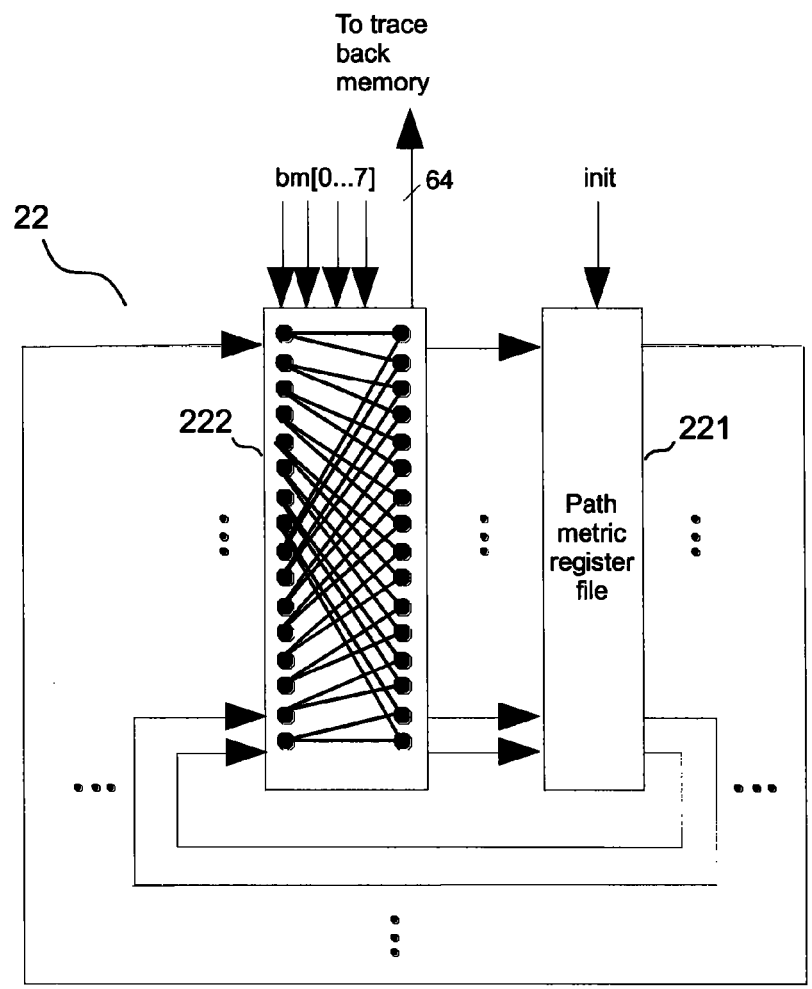
FIG. 6 shows a block diagram of the Viterbi path metric processor of FIG. 5.
Figure 7:
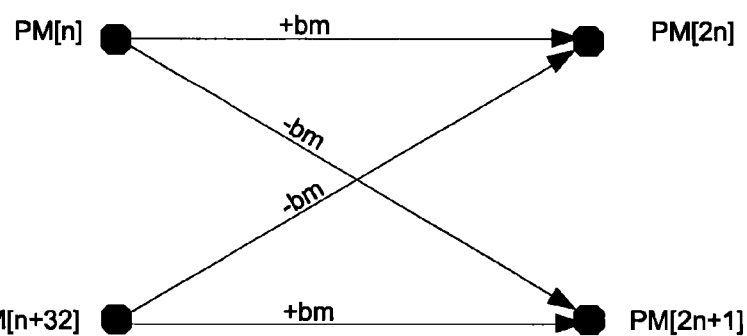
FIG. 7 illustrates Viterbi butterfly operation.

FIG. 6 shows a block diagram of Viterbi path metric processor 22 of FIG. 5. Viterbi path metric processor 22 comprises a path metric register file 221 that holds all path metrics for each trellis step, and an actual path metric calculation unit 222. For a constraint length 7 convolutional code, the path metric processor has 64 registers holding the so called Viterbi states. Path metric calculation unit 222 calculates the 32 butterfly operations according to the flow graph given in FIG. 7.

For every n=0, 1, . . . , 31, the corresponding branch metric for the butterfly operation is added and subtracted for the path metric states PM[n] and PM[n+32] of the previous trellis step to calculate two possible candidates for each path metric for the current trellis step, respectively. The candidates that are largest are selected and used to update the states in the path metric register file for PM[2n] and PM[2n+1]. The decision, if a candidate is selected from the lower or upper branch produces a decision bit. All 64 decision bits form a decision vector that is recorded for each trellis step in a trace back memory 23, as shown in FIG. 5.

With continuing reference to FIG. 5, when the last decision vector is written into trace back memory 23, i.e., after the complete input sequence has been processed by the path metric processor, a trace back process is started. The trace back unit 24 includes a state register which is preloaded with a presumably first state. Then, the bit belonging to that state is read from the decision vector last written into the trace back memory. The presumed state can only be reached from a lower or an upper branch of the trellis, i.e., state m can only be reached from state floor (m/2) or state floor (m/2)+32, the floor function mapping a real number to the next lower integer. If the decision bit is zero, the preceding presumed state is the lower state, if the decision bit is one, the preceding presumed state is the upper state. The new presumed state is updated and the decision bit is sent into a last-in first-out (LIFO) buffer. After this iteration, trace back unit 24 proceeds iteratively processing all decision vectors by repeating the previous steps. For the next iteration, the trace back unit assesses the decision bit belonging to the new presumed state, the decision bit being part of the next decision vector in trace back memory 23. The new presumed state is calculated, and the decision bit is written into the LIFO buffer. Trace back unit 24 continues until all decision vectors are processed. Blocks 21 through 24 are controlled by a finite state machine 25.

It is known from theory that after tracing back a certain number of iterations, it is likely that the trace back unit has found the most likely path in the trellis. The so called convergence length is reported to be roughly five times the constraint length of the code, i.e., for the LTE constraint length 7 convolutional code, 35 iterations are needed at most for the trace back unit to find the most likely path.

This is why the cyclic extension to the right of the input vector ideally should span at least 35 iterations. For decoding a tail biting convolutional code, the decision bits of the first trace back iterations that are belonging to the cyclic extension to the right do not need to be sent to the LIFO buffer. The LIFO buffer thus can be reduced to the maximum length of the original received rate de-matched convolutional encoded data.

The decision bits in the LIFO buffer are the decoded output sequence in reverse order. By reading out the LIFO buffer in reverse order, the output sequence that represents an estimate of the payload sent by the transmitter is obtained as an output of Viterbi decoder 2.

Referring to FIG. 2 again, the receiver takes the output sequences and calculates a 16 bit CRC checksum over the payload, as seen at 3 in FIG. 2. The receiver uses the same algorithm for calculating the CRC as the transmitter. The receiver calculated checksum is XORed to the received checksum, at 4, and the result is compared to the MAC-ID, in match detector 5. As mentioned above, there is a small likelihood that for randomly received data the result matches the MAC-ID even though no meaningful data has been received. One way to distinguish such a false positive from a genuine PDDCH is to make a plausibility check on the payload, i.e., check if the content is meaningful. However, as the content is very short and highly compressed, a likelihood of interpreting a false positive as a real received sequence remains.

The invention uses the principle of hard bit error estimation to get an additional criterion to distinguish between false positives and correctly decoded PDCCH frames.

Figure 8:
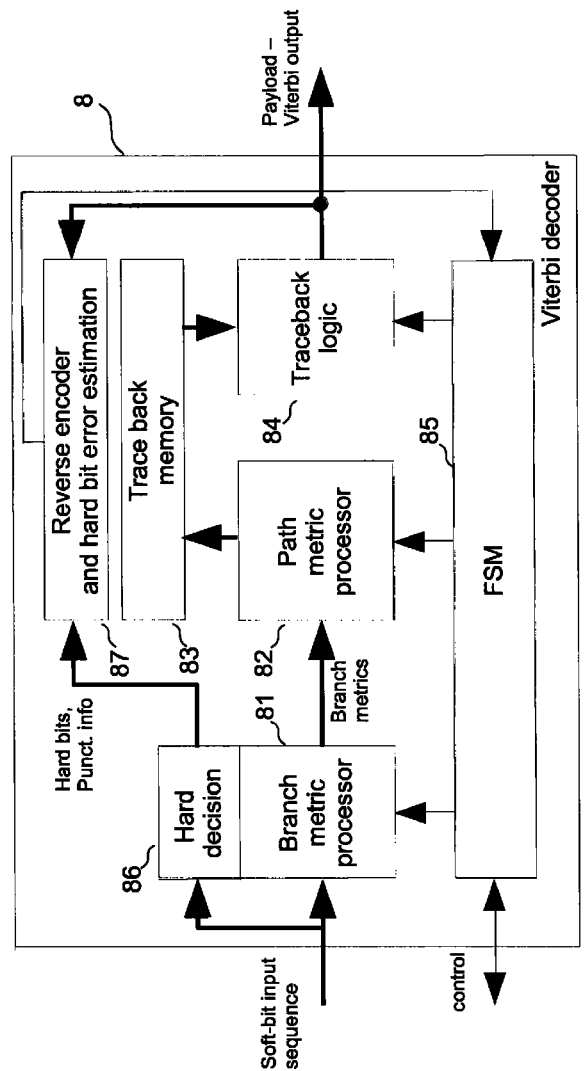
FIG. 8 shows a block diagram of a Viterbi decoder with error estimation capabilities according to the invention.

FIG. 8 shows a Viterbi decoder 8 with error estimation capabilities, according to the invention. Blocks 81 to 85 of Viterbi decoder 8 correspond to blocks 21 to 25, respectively, of conventional Viterbi decoder 2 as shown in FIG. 5. Additionally, however, the Viterbi decoder 8 according to the invention comprises a hard decision block 86 where the soft bits are hard-decided and presented to a reverse encoder and hard bit error estimation block 87 where they are recorded together with the information if the soft bit was a real received bit or inserted at the receiver by the rate de-matching block, as shown at 11 in FIG. 11. With the soft bit format introduced above, the hard bit is equivalent to the inverse sign bit of the soft bit. The information whether the bit was subject to de-puncturing can be either conveyed as an extra information with the soft-bit input sequence, or can be generated by simply comparing the soft-bits to zero in hard decision block 86. Reverse encoder and hard bit error estimation block 87 further receives the output of trace back logic 84 as an additional input. In block 87, the trace back information that represents the ML estimate of the received data is passed through an identical convolutional encoder as the one used at the transmitter side.

For best performance, trace back logic 84 may output the six last bits of the cyclic extension to the right to convolutional reverse encoder 871 in block 87 prior to the payload, for initialization of the reverse encoder internal states. Reverse encoder and hard bit error estimation block 87 then compares the re-encoded bit stream to the hard bit stream and counts the number of mismatches when the corresponding hard bit was not de-punctured. For statistical purposes and as a refinement to the criterion of detecting a false positive, the number of punctured bits may be counted as well.

Figure 9:
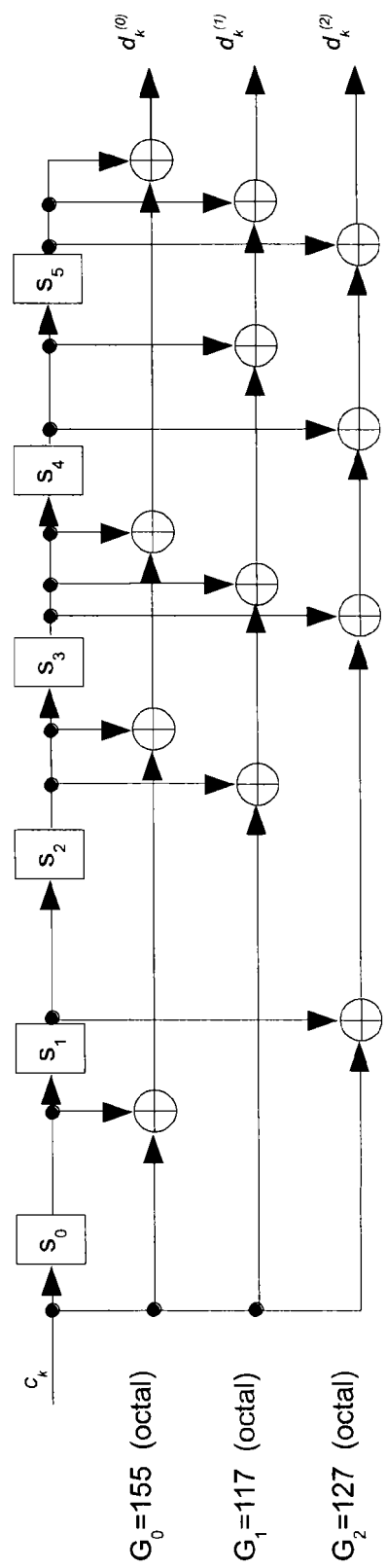
FIG. 9 shows a convolutional encoder with reversed 3GPP LTE polynomials.

One implementation variant of hard bit error estimation can be to implement the convolutional reverse encoder using reversed polynomials. The reverse polynomials of the 3GPP LTE polynomials $G_0$=133 (octal), $G_1$=171 (octal), and $G_2$=165 (octal) are $G_{0r}$=155 (octal), $G_{1r}$=117 (octal), and $G_{2r}$=127 (octal), respectively. The corresponding convolutional encoder is shown in FIG. 9.

In this case, the input to the reverse encoder inside the Viterbi decoder can be taken before the bits are sent to the LIFO buffer for bit reversal. One embodiment of trace back unit 84 in combination with error estimator 87 is shown in FIG. 10.

Figure 10:
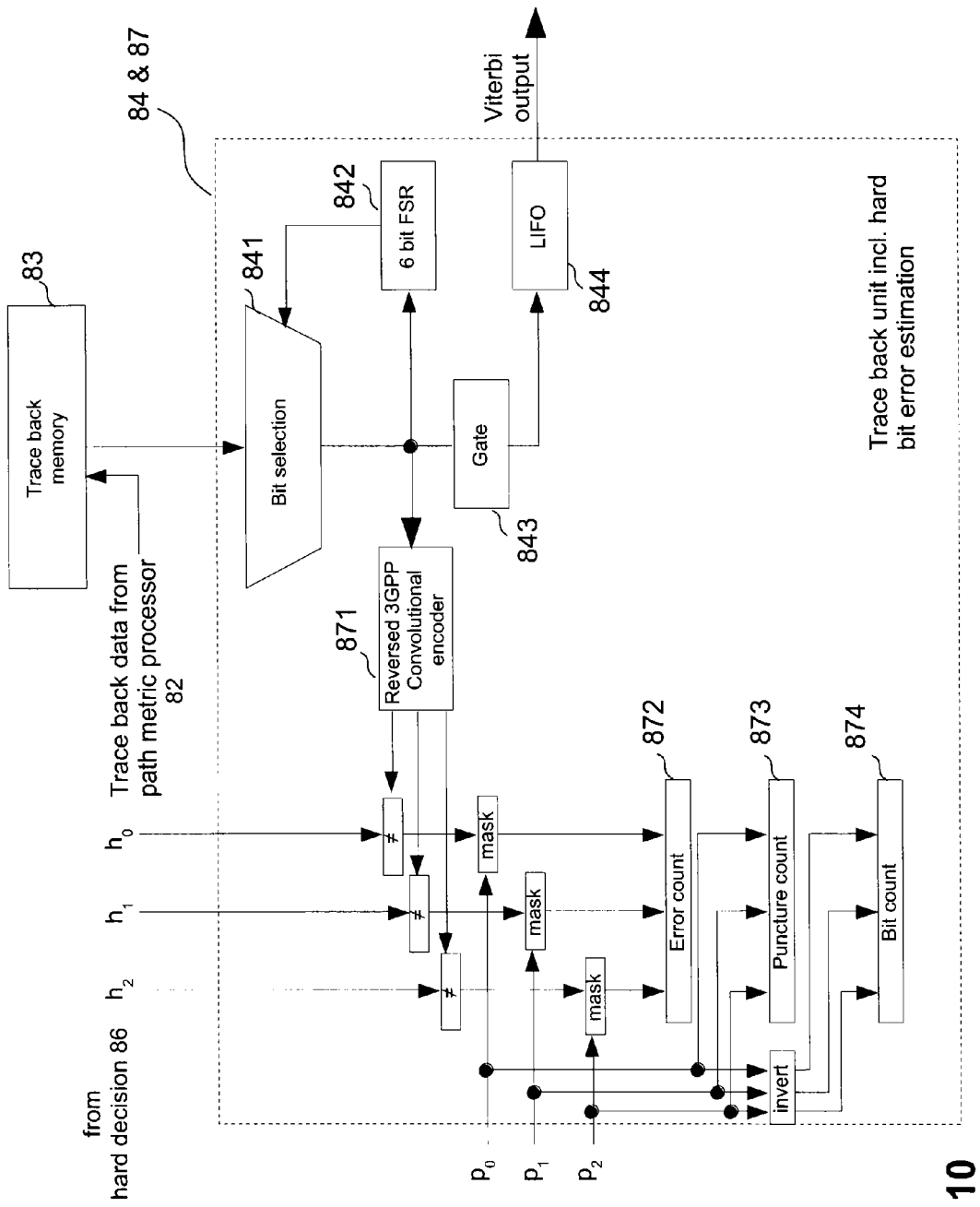
FIG. 10 shows a trace back unit including error estimation.

The trace back unit of FIG. 10 starts with reading the last decision vector from trace back memory 83. The state of the 6 bit Finite Shift Register (FSR), designated 842, is treated as a bit address to the bit in the 64 bit decision vector. The selected bit is shifted into the 6 bit FSR from the left for the next iteration. The bit is also shifted into bit reverse 3GPP convolutional encoder 871, for re-encoding. The process is repeated over all decision vectors for the right cyclic extension and for the code word part. Initially, output gate 843 is closed. For the decision vectors of the code word part, the output gate is opened.

For the decision vectors of the code word part, a triplet of hard decided bits, $h_0$, $h_1$, $h_2$, and a triplet of puncturing information, $p_0$, $p_1$, $p_2$, are read as well. Hard decided bits and puncturing information are read in the same order the soft bits are presented to the branch metric processor 81 shown in FIG. 8. The hard bits are compared to the reverse encoded data. If the puncturing bit is not set, a mismatch is counted, at 872. Otherwise, it is ignored. Also, the puncturing bits are counted, at 873, as well as the inverse number of puncturing bits, at 874, to give additional information of the received code block.

Figure 11:
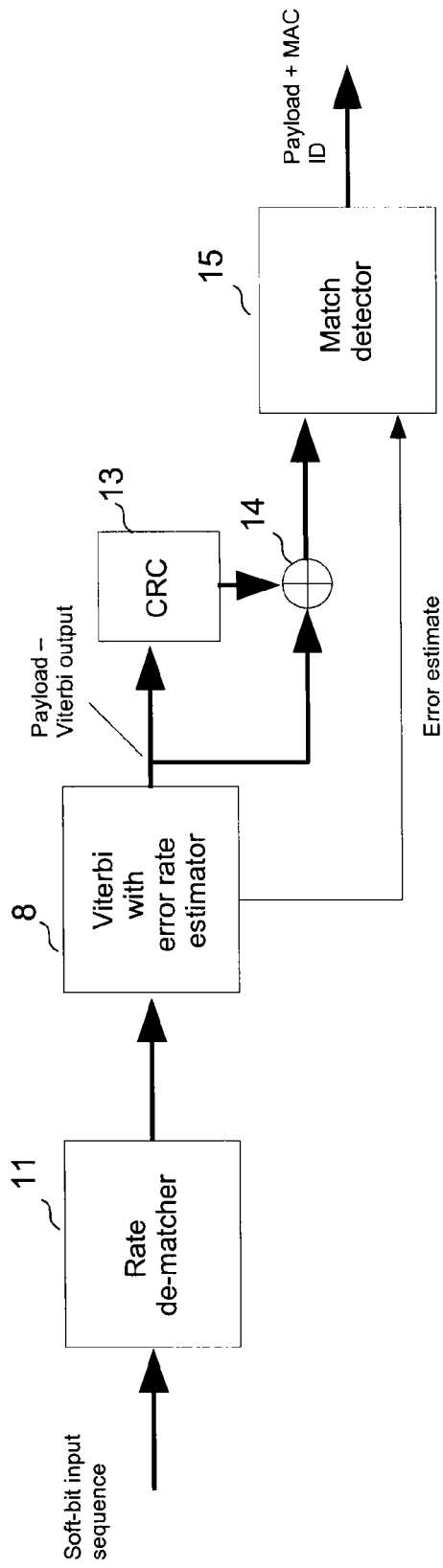
FIG. 11 shows a part of a baseband receiver chain including the Viterbi decoder of FIG. 8.

FIG. 11 shows a similar portion of a baseband receiver chain as depicted in FIG. 2, the function of blocks 11, 13, 14 corresponding to that of blocks 1, 3, 4 as described with reference to FIG. 2. However, the receiver chain of FIG. 11 includes the Viterbi decoder 8 according to the invention instead of conventional decoder 2. And, the total number of mismatches and number of non-punctured hard-bits are reported to match detector 15 which takes the error rate ratio into account, the error rate ratio being defined as the quotient of the number of mismatches and the number of non-punctured hard-bits. If the error rate ratio is above a certain defined threshold, the match detector rejects the decoded PDCCH regardless of a match of the MAC-ID.

In another embodiment of the invention, the reverse encoder and hard bit error estimation block 87 may additionally count the number of punctured bits and forward this information to the match detector as well. Match detector may then adapt the threshold according to the puncturing rate, since a high puncturing of information decreases the correction capabilities of the Viterbi decoder. To reduce implementation effort at Viterbi decoder 8 for decoding tail-biting convolutional codes, cyclic extensions to the left and right of the code block may already be performed by rate de-matching block 11.

One particular problem of PDCCH decoding in LTE is the strict timing requirement set forth by the standard. For blind decoding, a very short Viterbi decoding latency is of particular advantage since processing speeds can be reduced. By a specific rate de-matcher designed to produce the code block in reverse order, the reverse ordering mechanism typically implemented as a LIFO buffer and required in the trace back unit can be avoided. In the following embodiment, the rate de-matcher produces a sequence consisting of the cyclic extension to the left of the reverse ordered code block, the reverse ordered code block itself and a cyclic extension to the right of the reverse ordered code block. This sequence is presented to a Viterbi decoder similar to the one presented in FIG. 8 but one that is optimized to the reversed LTE polynomials, i.e., $G_0$=155 (octal), $G_1$=117 (octal), $G_2$=127 (octal). Thus, it treats the input sequence such as if it was encoded by a convolutional encoder as shown in FIG. 9. If this scheme is used, reverse encoder 871 of the trace back unit shown in FIG. 10 needs to implement the correct 3GPP polynomials, i.e., $G_0$=133 (octal), $G_1$=171 (octal), $G_2$=165 (octal).

As discussed before, for blind decoding the trace back unit 84 needs to initially trace back a certain number of trellis steps to find the most likely path. The likelihood of finding the most likely path can be increased by performing a search for the best metric over all metrics stored in the path metric register file after the last decision vector is written to trace back memory 83 and selecting the state that has the best metric as an initial state. The search algorithm can be implemented implicit by appending a zero vector of 18 zeros to the cyclically extended input vector. By doing so, after six trace back operations, the state with the best metric is found regardless of the initial state.

The invention claimed is:

1. A method for detecting validity of downlink control information in a telecommunications terminal, comprising the steps of:
   reverse encoding a bit output sequence of a Viterbi decoder of a baseband receiver of the terminal using a similar convolutional encoder as one used at a transmitting side to form a reverse encoded bit stream;
   determining hard bits from a soft-bit output sequence of a demapping operation of the baseband receiver to provide a determined hard bit stream;
   determining, for each of said hard bits, whether a soft-bit from which it was derived was a real received bit or was inserted at the receiver in a rate de-matching operation, to obtain a bit count of real received bits;
   comparing the reverse encoded bit stream to the determined hard bit stream and counting number of mismatches to obtain an error count;
   determining a bit error rate as a quotient of said error count and said bit count;
   comparing said bit error rate against a predefined threshold value; and
   assuming a payload to be invalid if said bit error rate is above said threshold value, even if a cyclic redundancy check of the payload gives a correct result.

2. The method of claim 1, wherein the step of reverse encoding comprises using six last bits of a cyclic extension to the right of a received code block to initialize the reverse encoding operation.

3. The method of claim 1, wherein the step of reverse encoding comprises using reversed polynomials.

4. The method of claim 1, further comprising the step of counting number of bits that have been omitted in a rate matching operation at the transmitting side.

5. The method of claim 4, further comprising the step of adapting said threshold value as a function of rate of omitted bits.

6. A Viterbi convolutional decoder, comprising:
   a branch metric processor;
   a path metric processor;
   a trace back memory;
   a trace back logic unit;
   a finite state machine;
   hard decision means operative to determine hard bits from a soft-bit input sequence to the Viterbi decoder; and
   reverse encoder and hard bit error estimator comprising:
      a reverse encoder similar to a convolutional decoder used at a transmitting side and operative to reverse encode a bit output sequence of said trace back logic unit to provide a reverse encoded bit stream;
      means for counting a number of non-punctured bits to obtain a bit count;
      means for counting a number of mismatches between the reverse encoded bit stream from the reverse encoder and a hard bit stream from the hard decision means to obtain an error count;
      wherein the Viterbi convolutional decoder is operative to provide said bit count and said error count for an additional validity check on payload bits output by the decoder.

7. The Viterbi convolutional decoder of claim 6, wherein the reverse encoder uses reversed polynomials for encoding.

8. An LTE baseband receiver, at least comprising:
   an equalizer;

a demapper;
a rate de-matcher;
a Viterbi convolutional decoder as set forth in claim 6;
a cyclic redundancy check (CRC) block operative to calculate a CRC checksum over a payload output from the decoder;
an XOR gate for XOR combining the calculated CRC checksum and a received checksum; and
a match detector operative to compare an output of the XOR gate to a Medium Access Control (MAC) identifier of the receiver to check for validity of the payload decoded by the Viterbi convolutional decoder;
wherein the decoder is operative to forward said bit count and said error count to the match detector; and
wherein the match detector is operative to:
   determine a bit error rate as a quotient of the error count and the bit count;
   compare said bit error rate against a predefined threshold value; and
   reject the payload as invalid in case the bit error rate is above said threshold value, irrespective of result of MAC identifier match.

9. The LTE baseband receiver of claim 8, wherein the rate de-matcher is operative to produce a code block of bits in reverse order, and wherein the reverse encoder of the Viterbi convolutional decoder uses non-reversed polynomials for encoding.

\* \* \* \* \*